United States Patent
Chang et al.

(10) Patent No.: US 10,772,195 B2
(45) Date of Patent: Sep. 8, 2020

(54) TWO-DIMENSIONAL DATA MATRIX STRUCTURE AND THE FABRICATION METHOD THEREOF

(71) Applicant: Unimicron Technology Corp., Taoyuan (TW)

(72) Inventors: Jun-Jie Chang, New Taipei (TW); Shian-Tang Chang, Taoyuan (TW); Dung-Ying Sung, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 178 days.

(21) Appl. No.: 15/980,739

(22) Filed: May 16, 2018

(65) Prior Publication Data
US 2019/0327826 A1 Oct. 24, 2019

(30) Foreign Application Priority Data
Apr. 20, 2018 (TW) .............................. 107113607 A

(51) Int. Cl.
| | |
|---|---|
| *B32B 3/24* | (2006.01) |
| *H05K 1/02* | (2006.01) |
| *B23K 26/386* | (2014.01) |
| *H05K 3/46* | (2006.01) |
| *H05K 3/00* | (2006.01) |
| *B23K 103/16* | (2006.01) |
| *B32B 3/26* | (2006.01) |

(52) U.S. Cl.
CPC ......... *H05K 1/0266* (2013.01); *B23K 26/386* (2013.01); *H05K 3/0026* (2013.01); *H05K 3/4644* (2013.01); *B23K 2103/166* (2018.08); *B32B 3/266* (2013.01); *H05K 2201/09827* (2013.01); *H05K 2201/09927* (2013.01); *H05K 2203/107* (2013.01); *Y10T 428/24322* (2015.01); *Y10T 428/24331* (2015.01)

(58) Field of Classification Search
CPC ............ B32B 3/266; Y10T 428/24331; Y10T 428/24322
See application file for complete search history.

(56) References Cited

U.S. PATENT DOCUMENTS 5,281,464 A * 1/1994 Sekioka ................. F16J 15/061
277/598

FOREIGN PATENT DOCUMENTS

TW 201404257 A 1/2014

* cited by examiner

*Primary Examiner* — William P Watkins, III
(74) *Attorney, Agent, or Firm* — CKC & Partners Co., LLC

(57) ABSTRACT

A two-dimensional data matrix structure includes a first substrate, a first metal layer disposed on the first substrate, a second substrate disposed on the first metal layer, and a second metal layer disposed on the second substrate. The first metal layer has a plurality of sections and a plurality of empty regions formed according to a two-dimensional data matrix pattern. The first substrate, the second substrate, and the second metal layer commonly have a plurality of through holes, and positions of the through holes correspond to positions of the empty regions. The second substrate and the second metal layer commonly have a plurality of blind holes, and positions of the blind holes correspond to positions of the sections. The sections are exposed through the blind holes, and the configuration of the through holes and the blind holes is the two-dimensional data matrix pattern when viewed from above.

10 Claims, 8 Drawing Sheets

TWO-DIMENSIONAL DATA MATRIX STRUCTURE AND THE FABRICATION METHOD THEREOF

CROSS-REFERENCE TO RELATED APPLICATION

This application claims priority to Taiwan Application Serial Number 107113607, filed Apr. 20, 2018, the disclosure of which is incorporated herein by reference in its entirety.

BACKGROUND

Conventional fabrication methods for a two-dimensional data matrix structure on a substrate with copper surface captures the two-dimensional data matrix image under a copper plate by using a X-ray laser, and then forming through holes corresponding to the image captured. The difference between the copper plate and the through holes will form the two-dimensional data matrix pattern. However, an extra off-line process is required to utilize the X-ray laser, which increases space costs, time costs and maintenance costs, and causes radiation concerns.

When fabricating the two-dimensional data matrix structure using the conventional method, the lack of surface treatment on the copper plate causes a scattering of laser light, this degrades the efficiency of forming the through holes. Furthermore, it's easy to form undesired structures like a volcanic hole around the through holes, as well as collapse problems which may happen easily.

SUMMARY

One embodiment of the present invention is to provide a two-dimensional data matrix structure.

According to some embodiments of the present invention, the two-dimensional data matrix structure includes a first substrate, a first metal layer, a second substrate, and a second metal layer. The first metal layer is disposed on the first substrate, the first metal layer has a plurality of sections and a plurality of empty regions that are formed according to a two-dimensional data matrix pattern, and each of the empty regions is between two of the sections. The second substrate is disposed on the first metal layer, and the second metal layer is disposed on the second substrate. The first substrate, the second substrate, and the second metal layer commonly have a plurality of through holes, and positions of the through holes correspond to positions of the empty regions. The second substrate and the second metal layer commonly have a plurality of blind holes, and positions of the blind holes correspond to positions of the sections. The sections of the first metal layer are exposed through the blind holes, and the configuration of the through holes and the blind holes is the two-dimensional data matrix pattern when viewed from above.

In some embodiments of the present invention, the first metal layer and the second metal layer are electrically insulated from each other.

In some embodiments of the present invention, diameters of the blind holes and diameters of the through holes are in a range from 250 nm to 270 nm.

In some embodiments of the present invention, the diameters of the blind holes and the diameters of the through holes are substantially the same.

In some embodiments of the present invention, widths of the sections of the first metal layer are greater than diameters of the blind holes.

In some embodiments of the present invention, the two-dimensional data matrix structure of the two-dimensional data matrix structure further includes a third metal layer disposed on a surface of the first substrate facing away from the first metal layer.

In some embodiments of the present invention, the first substrate and the second substrate respectively have a first sidewall and a second sidewall facing one of the through holes, one of the sections of the first metal layer has a third sidewall facing one of the through holes, and the third sidewall is recessed in the first sidewall and the second sidewall.

Another embodiment of the present invention is to provide a fabrication method of a two-dimensional data matrix structure.

According to some embodiments of the present invention, the fabrication method of a two-dimensional data matrix structure includes forming a first metal layer on the first substrate, the first metal layer has a plurality of sections and a plurality of empty regions that are formed according to a two-dimensional data matrix pattern; forming a second substrate on the first metal layer; forming a second metal layer on the second substrate; and forming a plurality of through holes in the first substrate, the second substrate and the second metal layer and forming a plurality of blind holes in the second substrate and the second metal layer by using a laser, positions of the through holes correspond to positions of the empty regions, positions of the blind holes correspond to positions of the sections, and the configuration of the through holes and the blind holes forms the two-dimensional data matrix pattern when viewed from above.

In some embodiments of the present invention, the fabrication method of a two-dimensional data matrix structure further includes performing a surface treatment on the second metal layer before forming the through holes and the blind holes by using a laser.

In some embodiments of the present invention, the fabrication method of a two-dimensional data matrix structure further includes positioning a plurality of positions of a plurality of two-dimensional matrix holes on the second metal layer according to the two-dimensional data matrix pattern before forming the through holes and the blind holes by using a laser, and the positions of the two-dimensional matrix holes are the positions of the through holes and the blind holes.

In the foregoing embodiments of the present invention, the first metal layer is designed as the sections and the empty regions between the first substrate and the second substrate according to the two-dimensional data matrix pattern by the imaging design method, such that the through holes can be formed in the first substrate, the second substrate, and the second metal layer, and the blind holes can be formed in the second substrate and the second metal layer. The image contrast between the first metal layer exposed from the blind holes and the empty through holes may represent the two-dimensional data matrix pattern.

DETAILED DESCRIPTION

Figure 1:
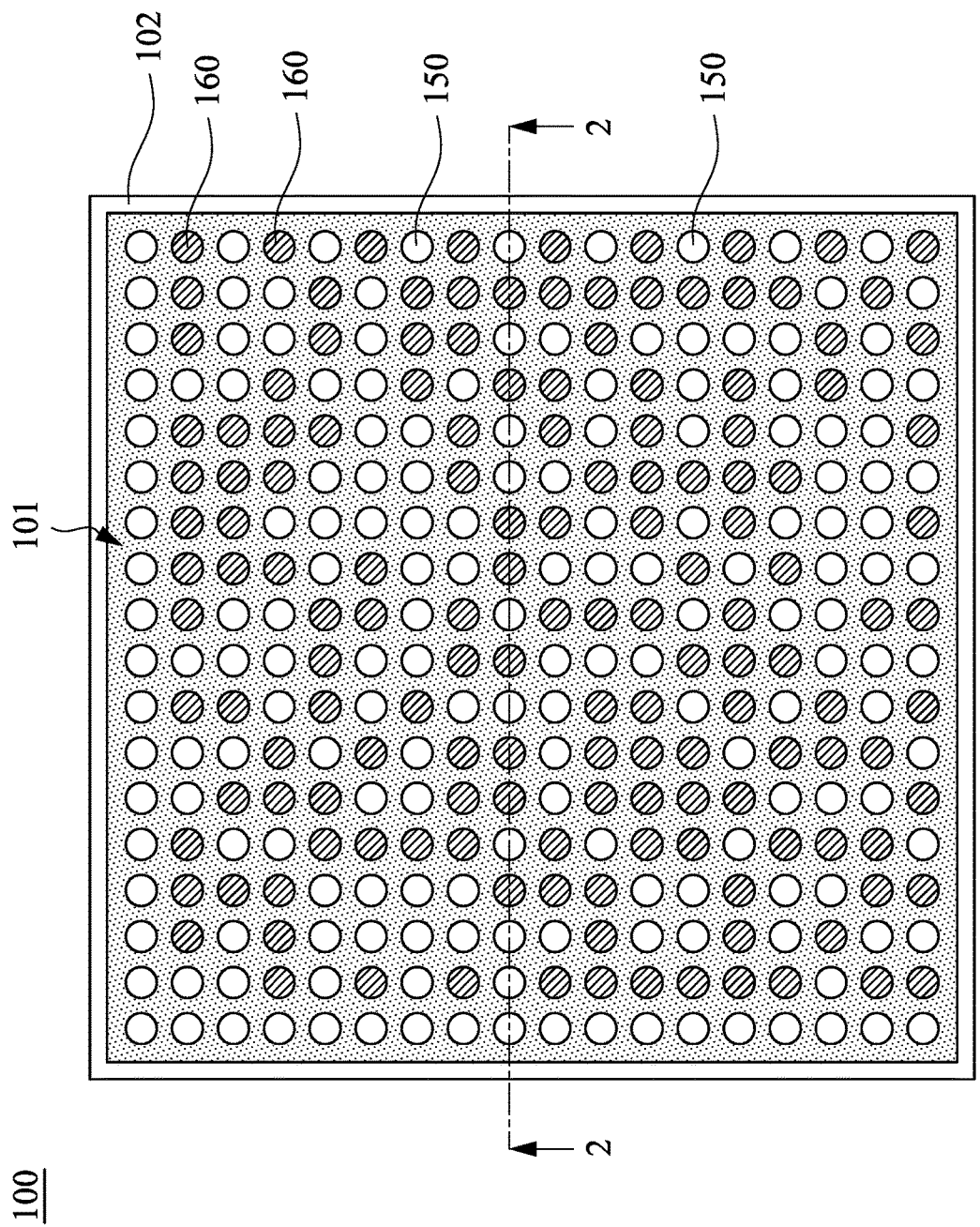
FIG. 1 is a top view of a two-dimensional data matrix structure according to one embodiment of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

FIG. 1 is a top view of a two-dimensional data matrix structure according to one embodiment of the present disclosure. In the present embodiment, the two-dimensional data matrix structure 100 is formed on the circuit board 102, and the configuration of two-dimensional data matrix structure 100 is a two-dimensional data matrix pattern 101 when viewed from above. The circuit board 102 is not necessary, the utilization of circuit board 102 depends on requirements, which is not limited in this regard. The two-dimensional data matrix pattern 101 is formed through the arrangement of the blind holes 160 and the through holes 150, and the two-dimensional data matrix pattern 101 can be identified through the image contrast between the blind holes 160 and the through holes 150.

Figure 2:
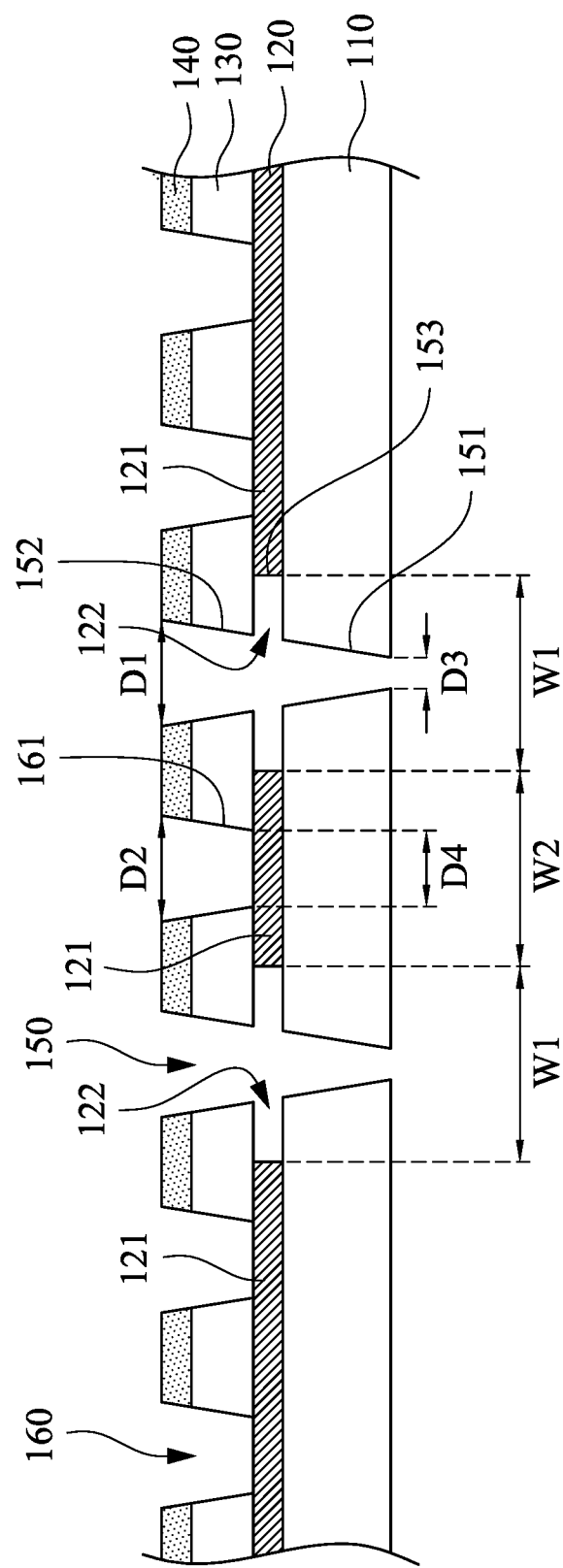
FIG. 2 is a part of the cross section view along a line 2-2 of the two-dimensional data matrix structure in FIG. 1.

FIG. 2 is a part of the cross section view along a line 2-2 of the two-dimensional data matrix structure 100 in FIG. 1. Reference is made simultaneously to FIG. 1 and FIG. 2, the two-dimensional data matrix structure 100 includes a first substrate 100, a first metal layer 120, a second substrate 130, and a second metal layer 140. The first metal layer 120 is disposed between the first substrate 110 and the second substrate 130 and has a plurality of sections 121 and a plurality of empty regions 122 that are formed according to the two-dimensional data matrix pattern 101, and each of the empty region 122 is between two of the sections 121. The second substrate 130 is disposed between the first metal layer 120 and the second metal layer 140. The first substrate 110, the second substrate 130, and the second metal layer 140 commonly have a plurality of through holes 150, and positions of the through holes 150 correspond to positions of the empty regions 122. The second substrate 130 and the second metal layer 140 commonly have a plurality of blind holes 160, and positions of the blind holes 160 correspond to positions of the sections 121. The sections 121 of the first metal layer 120 are exposed through the blind holes 160, and the configuration of the through holes 150 and the blind holes 160 is the two-dimensional data matrix pattern 101 when viewed from above.

In the present embodiment, the first metal layer 120 is designed as the sections 121 and the empty regions 122 between the first substrate 110 and the second substrate 130 according to the two-dimensional data matrix pattern 101 by the image design method, such that the formation of the through holes 150 and the blind holes 160 by using a laser can be performed in one step. The image contrast between the first metal layer 120 exposed from the blind holes 160 and the empty through holes 150 may represent the two-dimensional data matrix pattern 101.

In the present embodiment, the first metal layer 120 and the second metal layer 140 of the two-dimensional data matrix structure 100 are electrically insulated from each other. In some embodiments, the material of the first metal layer 120 and the second metal layer 140 may be copper.

Reference is made to FIG. 1 and FIG. 2 continuously. In the present embodiment, the through holes 150 of the two-dimensional data matrix structure 100 have diameters D1 at the surface of the second metal layer 140, and the blind holes 160 of the two-dimensional data matrix structure 100 have diameters D2 at the surface of the second metal layer 140. The diameters D1 and the diameters D2 are substantially the same, and the diameters D1 and the diameters D2 may be in a range from 250 nm to 270 nm.

In the present embodiment, the through holes 150 have diameters D3 at the bottom surface of the first substrate 110, and the diameters D3 are smaller than the diameters D1. The empty regions 122 of the first metal layer 120 have widths W1, and the widths W1 may greater than the diameters D1 and the diameters D3 of the through holes 150. The first substrate 110 and the second substrate 130 of the two-dimensional data matrix structure 100 respectively have first sidewalls 151 and second sidewalls 152 facing the through holes 150, and profiles of the first sidewalls 151 of the first substrate 110 are smaller than profiles of the second sidewalls 152 of the second substrate 130. The sections 121 of the first metal layer 120 have third sidewalls 153 facing the through holes 150, and the third sidewalls 153 may be recessed in the first sidewalls 151 and the second sidewalls 152. Furthermore, in the present embodiment, the distance between two adjacent third sidewalls 153 is the width W1 of each of the empty regions 122. In other words, any diameters between diameters D1 and the diameters D3 of the through holes 150 is smaller than the width W1.

In the present embodiment, the blind holes 160 have diameters D4 at the bottom surface of the second substrate 130, and the diameters D4 are smaller than the diameters D2. The sections 121 of the first metal layer 120 may have widths W2, and the widths W2 are greater than the diameters D2 and the diameters D4 of the blind holes 160. The second substrate 130 and the second metal layer 140 of the two-dimensional data matrix structure 100 commonly have blind hole sidewalls 161 facing the blind holes 160, and profiles of the blind hole sidewalls 161 gradually decrease from the second metal layer 140 to the second substrate 130.

Figure 3:
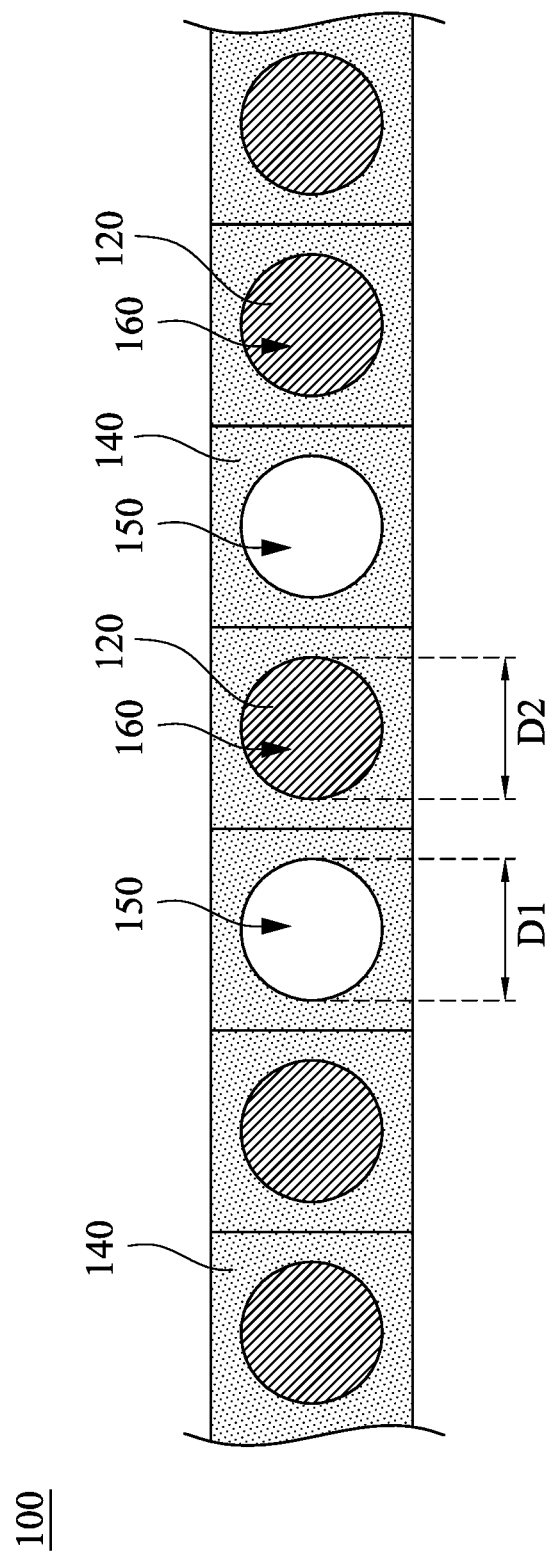
FIG. 3 is a top view of the part of the two-dimensional data matrix structure in FIG. 2.

FIG. 3 is a top view of the part of the two-dimensional data matrix structure in FIG. 2. Reference is made to FIG. 2 and FIG. 3 simultaneously, in the top view, the two-dimensional data matrix 100 includes the second metal layer 140, the through holes 150, the blind holes 160, and the first metal layer 120 exposed from the blind holes 160. For clear illustration, only the diameters D1 of the through holes 150 and the diameters D2 of the blind holes 160 on the surface of the second metal layer 140 are shown in FIG. 3.

In the present embodiment, the through holes 150 are prevented form shielding by the first metal layer 120 by making the widths W1 of the empty regions 122 greater than the diameters D1 and the diameters D3 of the through holes 150, and the bottoms of the blind holes 160 can be completely closed by the first metal layer 120 by making the widths W2 of the sections 121 greater than the diameters D2 and the diameters D4. Therefore, the product yield rate of the two-dimensional data matrix structure 100 can be raised.

In the present embodiment, the sections 121 and the empty regions 122 can be in rectangular shape. In some other embodiments, the sections 121 and the empty regions 122 can be in any shape. It is noted that, the widths W2 of the sections 121 and the widths W1 of the empty regions 122 can be the same or can be different, as long as the widths W1 of the empty regions 122 are large enough to prevent the sections 121 from extending into the through holes 150, and the widths W2 of the sections 121 are large enough to make the bottom of the blind holes 160 be closed completely by the sections 121 of the first metal layer 120.

Figure 4:
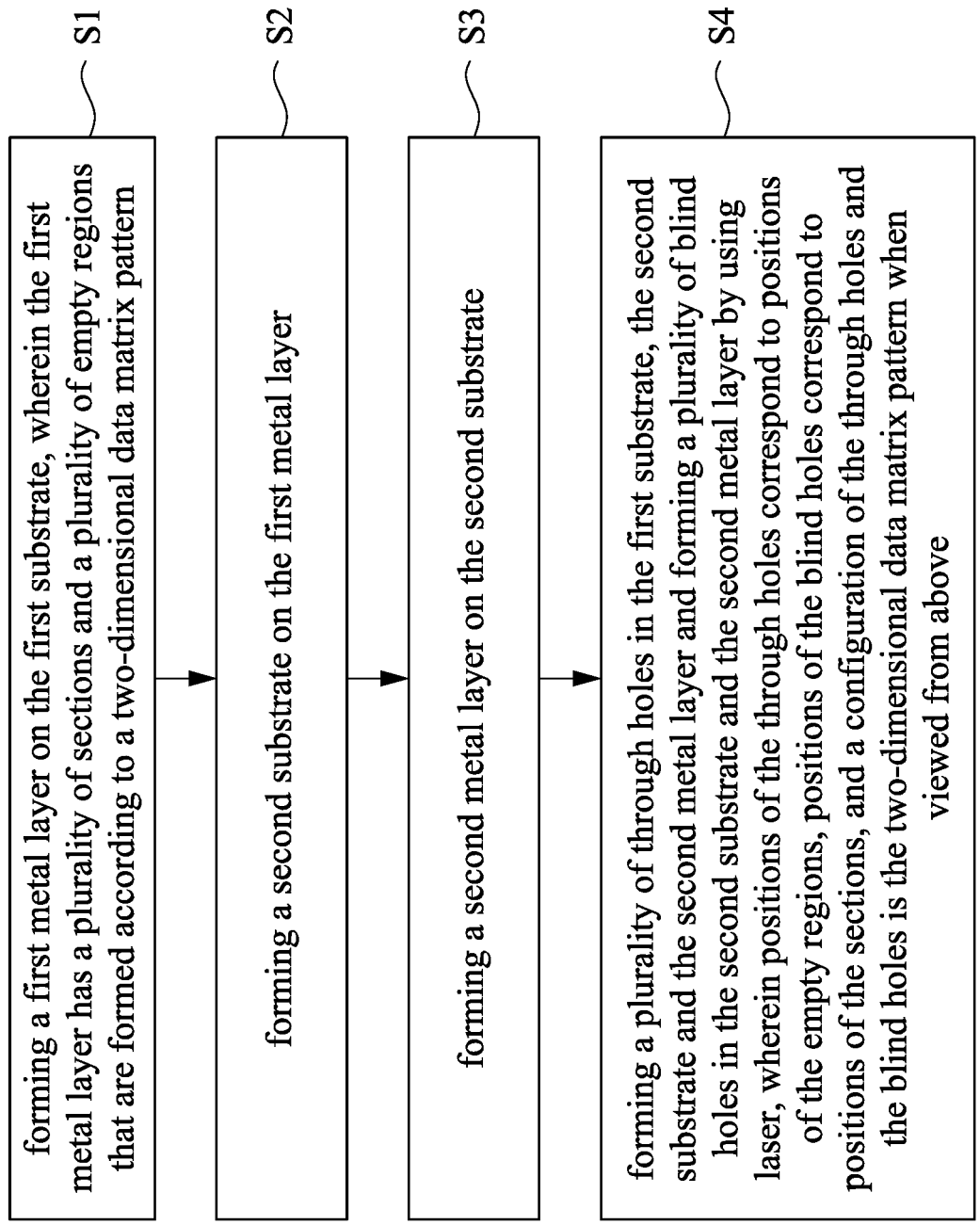
FIG. 4 is a flow chart of a fabrication method of the two-dimensional data matrix structure according to one embodiment of the present disclosure.

FIG. 4 is a flow chart of a fabrication method of the two-dimensional data matrix structure according to one embodiment of the present disclosure. First, in step S1, the first metal layer is formed on the first substrate, and the first metal layer includes a plurality of sections and a plurality of empty regions that are formed according to the two-dimensional data matrix pattern. In step S2, the second substrate is formed on the first metal layer. In step S3, the second metal layer is formed on the second substrate. Finally, in step S4, a plurality of through holes are formed in the first substrate, the second substrate and the second metal layer, and forming a plurality of blind holes in the second substrate and the second metal layer by using a laser The positions of the through holes correspond to positions of the empty regions, the positions of the blind holes correspond to positions of the sections, and a configuration of the through holes and the blind holes forms the two-dimensional data matrix pattern when viewed from above. In the following description, the foregoing steps will be explained.

Figure 5:
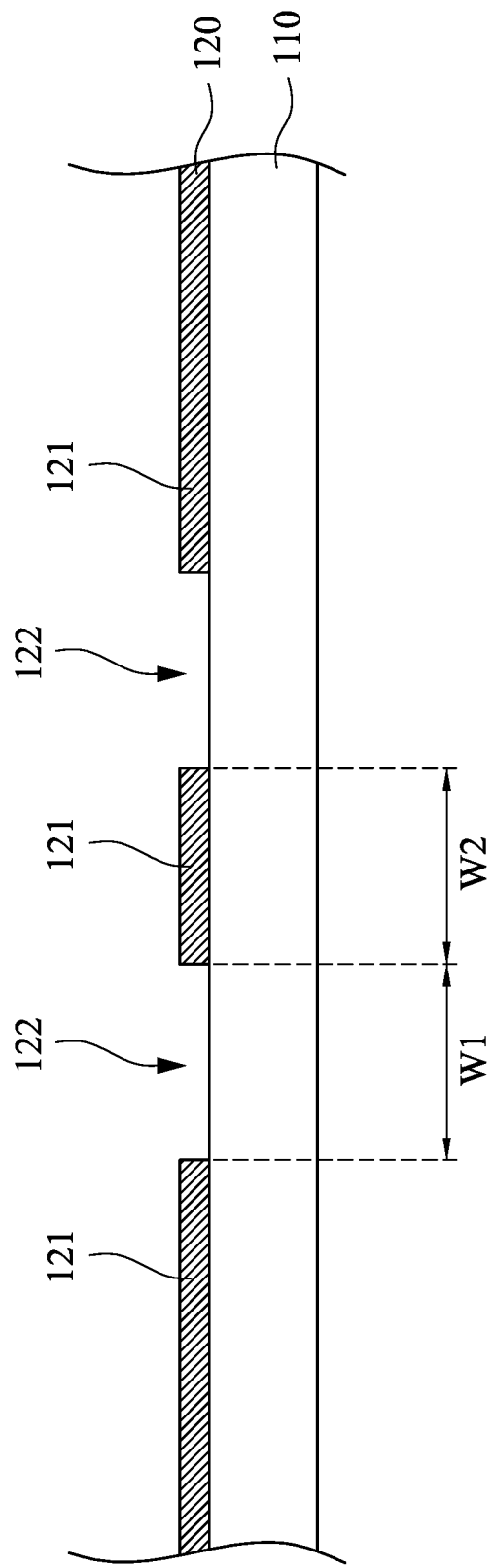
FIG. 5 to FIG. 7 are the parts of the cross section views at different stages according to the fabrication method in FIG. 4.
Figure 6:
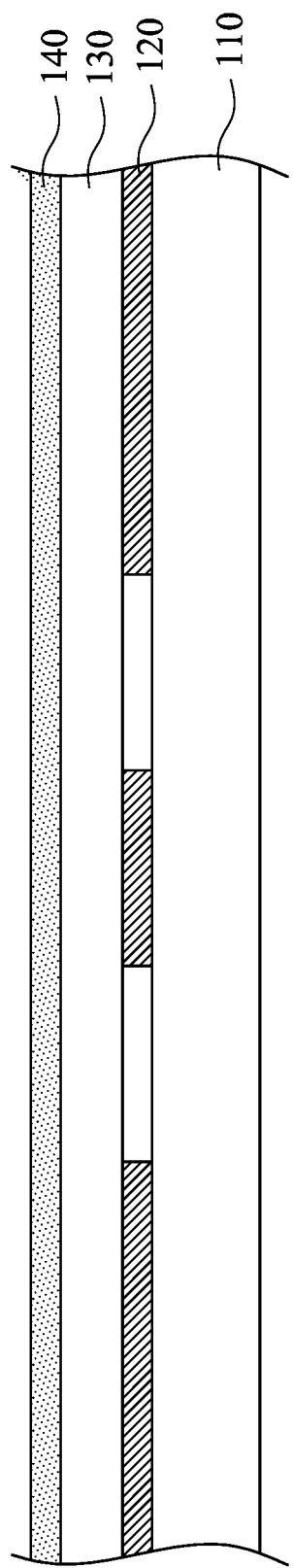
Figure 7:
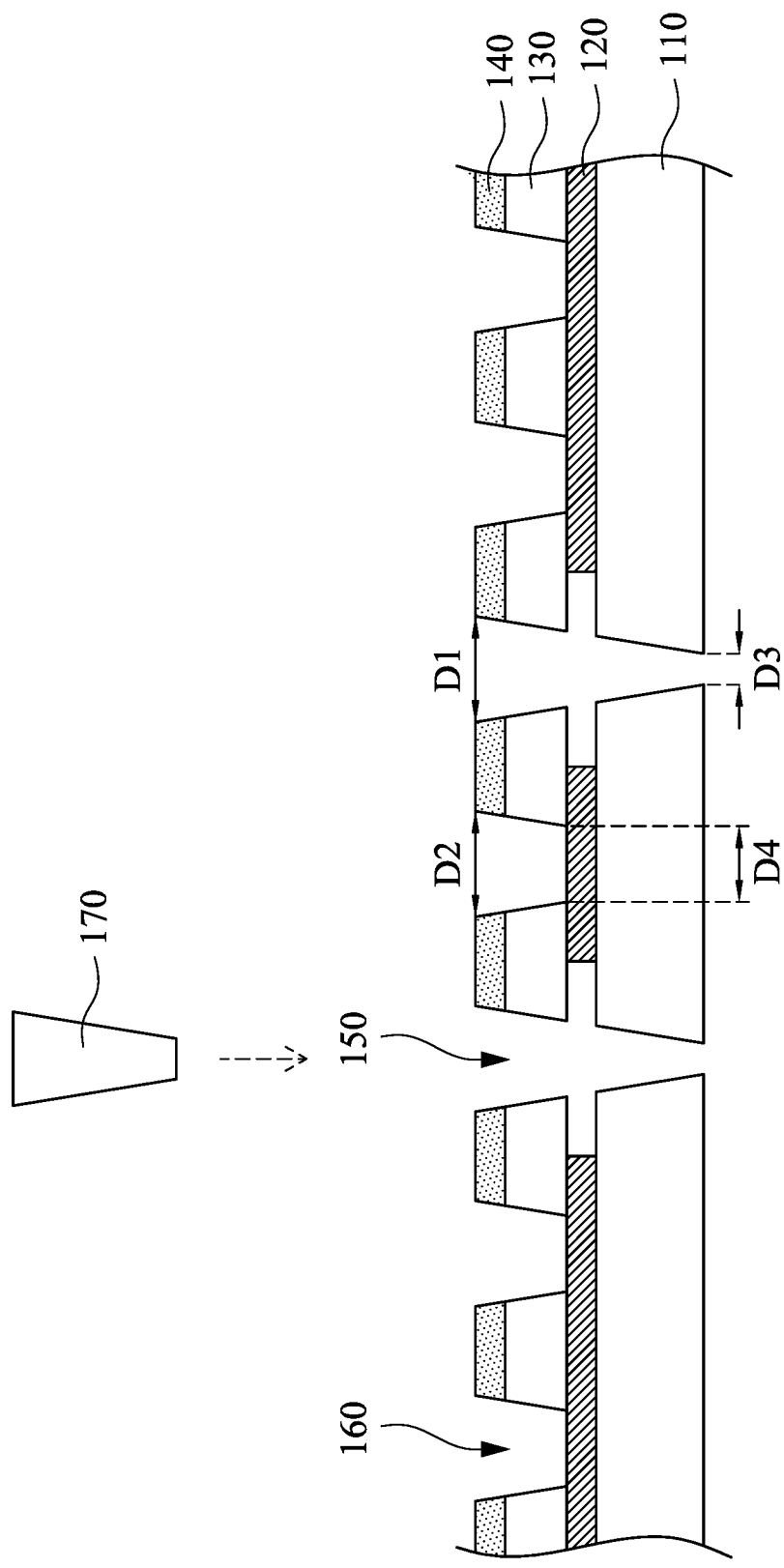

FIG. 5 to FIG. 7 are the parts of the cross section views at different stages according to the fabrication method in FIG. 4.

Reference is made to FIG. 1 and FIG. 5 simultaneously. In step S1, provides a first substrate 110, and then forms a first metal layer 120 on the first substrate 110. The first metal layer 120 includes a plurality of sections 121 and a plurality of empty regions 122 that are formed according to the two-dimensional data matrix pattern 101, such that the first substrate 110 is exposed from the empty regions 122. Furthermore, in the present embodiment, the sections 121 of the first metal layer 120 may have widths W2, and the empty regions 122 of the first metal layer 120 may have widths W1.

Reference is made to FIG. 1 and FIG. 6 simultaneously. In step S2 and the step S3, forms the second substrate 130 on the first metal layer 120, and then forms the second metal layer 140 on the second substrate 130. Furthermore, the fabrication method of the two-dimensional data matrix structure 100 further includes performing the surface treatment on the second metal layer 140. In some embodiments, methods of the surface treatment may include hot air solder leveling (HASL), electroless nickel immersion gold (ENIG), or forming an organic solderability preservative, but those methods are not intended to limit the present embodiment, and a person skilled in the art can choose the methods for the surface treatments depend on the requirements.

The scattering of the laser on the second metal layer 140 can be reduced in the following processes by performing the surface treatment on the second metal layer 140, and the energy of the laser can be concentrated to prevent the structures like volcano holes and the collapsing of holes. After the performance of the surface treatment on the second metal layer 140, the processes of forming the through holes 150 and the blind holes 160 can be combined with the internal circuit process of the circuit board 102. There is no need of the extra off-line processes, and the space cost and the time cost can be reduced. Furthermore, since the typical x-ray laser in the conventional process is not required, the safety concern of the operation environment is also reduced.

Reference is made to FIG. 1 and FIG. 7 simultaneously. In the present embodiment, positions a plurality of positions of a plurality of two-dimensional data matrix holes on the second metal layer 140 according to the two-dimensional data matrix pattern 101 first. And then in step S4, perforations at the locations of the two-dimensional data matrix holes on the second metal layer 140 in order by using a laser 170. Furthermore, in the present embodiment, the parameters of the laser 170 can be adjusted to break through the second metal layer 140, but not break through the first metal layer 120.

Therefore, by forming the first metal layer 120 according to the two-dimensional data matrix pattern 101 and combining the processes of the through holes 150 and the blind holes 160 with the internal circuit processes of the electric board 102, the forming of a plurality of through holes 150 in the first substrate 110, the second substrate 130, and the second metal layer 140 and the forming of a plurality of blind holes 160 in the second substrate 130 and the second metal layer 140 can be done in the same step, and the configuration of the through holes 150 and the blind holes 160 is the two-dimensional data matrix pattern 101 when viewed from above.

In the present embodiment, the diameters D1, the diameters D3 of the through holes 150, and the diameters D2, the diameters D4 of the blind holes are all in a range from 250 nm to 270 nm. In general, diameters of the conductive blind holes used for filling a conductive material in the internal circuit of the circuit board 102 are about 70 nm, while the diameters of the through holes 150 and the blind holes 160 are about 260 nm. The absorption efficiency for the plating solution of the blind holes 160 can be reduced in the following processes by enlarging the difference between the diameters of the blind holes 160 of the two-dimensional data matrix structure 100 and the diameters of the conductive blind holes used for filling conductive material. Therefore, the formation of the blind holes 160 and the conductive blind holes can be done in the same laser process, the electrical connection between the blind holes 160 and the conductive blind holes can be prevented, and there is no need for the extra shielding process to separate the processes of the blind holes 160 and the conductive blind holes.

It is noted that, in the present embodiment, the two-dimensional data matrix structure 100 is formed on the circuit board 102, the number of the first substrate 110 and the second substrate 130, and the number of the first metal layer 120 and the second metal layer 140 are merely exemplary, and a person skilled in the art can use more layers of the substrates and the metal layers depend on the actual requirements.

Figure 8:
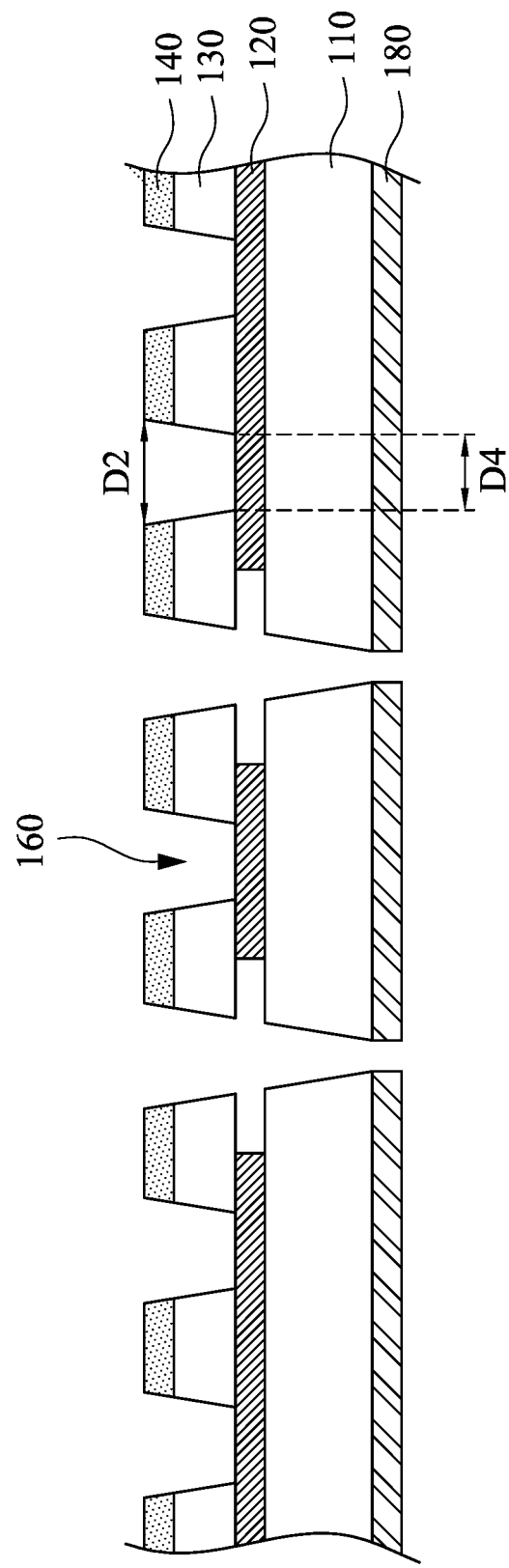
FIG. 8 is a part of the cross section view of a two-dimensional data matrix structure according to another embodiment of the present disclosure.

FIG. 8 is a part of the cross section view of a two-dimensional data matrix structure 100a according to another embodiment of the present disclosure. The two-dimensional data matrix structure 100a includes the first substrate 110, the first metal layer 120, the second substrate 130, and the second metal layer 140. The difference with the embodiment in FIG. 2 is that: the two-dimensional data matrix structure 100a further includes the third metal layer 180. The third metal layer 180 is disposed on the surface of the first substrate 110 facing away from the first metal layer 120, that is, disposed at the bottom surface of the first substrate 110. In the present embodiment, after forming the two-dimensional data matrix structure 100 as shown in FIG. 7, the third metal layer 180 can be plated, and substrates or metal layers can be piled up. Furthermore, since the diameters D2 and the diameters D4 of the blind holes 160 are adjusted to prevent the electroplating solution be absorbed by the blind holes 160, the process of the two-dimensional data matrix structure 100a can be easily combined with the process of the internal circuit in the circuit board 102 as shown in FIG. 1, extra space cost and time cost are not required, and there is no concern about disturbance to the internal circuits.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A two-dimensional data matrix structure, comprising:
   a first substrate;
   a first metal layer disposed on the first substrate, wherein the first metal layer has a plurality of sections and a plurality of empty regions that are formed according to a two-dimensional data matrix pattern, and each of the empty regions is between two of the sections;
   a second substrate disposed on the first metal layer; and
   a second metal layer disposed on the second substrate, wherein the first substrate, the second substrate, and the second metal layer commonly have a plurality of through holes, positions of the through holes correspond to positions of the empty regions, the second substrate and the second metal layer commonly have a plurality of blind holes, positions of the blind holes correspond to positions of the sections, the sections of the first metal layer are exposed through the blind holes, and a configuration of the through holes and the blind holes is the two-dimensional data matrix pattern when viewed from above.

2. The two-dimensional data matrix structure of claim 1, wherein the first metal layer and the second metal layer are electrically insulated from each other.

3. The two-dimensional data matrix structure of claim 1, wherein diameters of the blind holes and diameters of the through holes are in a range from 250 nm to 270 nm.

4. The two-dimensional data matrix structure of claim 3, wherein the diameters of the blind holes and the diameters of the through holes are substantially the same.

5. The two-dimensional data matrix structure of claim 1, wherein widths of the sections of the first metal layer are greater than diameters of the blind holes.

6. The two-dimensional data matrix structure of claim 1, further comprising:
   a third metal layer disposed on a surface of the first substrate facing away from the first metal layer.

7. The two-dimensional data matrix structure of claim 1, wherein the first substrate and the second substrate respectively has a first sidewall and a second sidewall facing one of the through holes, one of the sections of the first metal layer has a third sidewall facing one of the through holes, and the third sidewall is recessed in the first sidewall and the second sidewall.

8. A fabrication method of a two-dimensional data matrix structure, comprising:
   forming a first metal layer on the first substrate, wherein the first metal layer has a plurality of sections and a plurality of empty regions that are formed according to a two-dimensional data matrix pattern;
   forming a second substrate on the first metal layer;
   forming a second metal layer on the second substrate; and
   forming a plurality of through holes in the first substrate, the second substrate and the second metal layer and forming a plurality of blind holes in the second substrate and the second metal layer by using a laser, wherein positions of the through holes correspond to positions of the empty regions, positions of the blind holes correspond to positions of the sections, and a configuration of the through holes and the blind holes is the two-dimensional data matrix pattern when viewed from above.

9. The fabrication method of a two-dimensional data matrix structure of claim 8, further comprising:
   performing a surface treatment on the second metal layer before forming the through holes and the blind holes by using a laser.

10. The fabrication method of a two-dimensional data matrix structure of claim 8, further comprising:
    positioning a plurality of positions of a plurality of two-dimensional matrix holes on the second metal layer according to the two-dimensional data matrix pattern before forming the through holes and the blind holes by using a laser, wherein the positions of the two-dimensional matrix holes are the positions of the through holes and the blind holes.

* * * * *